United States Patent [19]

Aoki et al.

[11] 4,385,473
[45] May 31, 1983

[54] METHOD FOR FREQUENCY REGULATION OF TUNING-FORK VIBRATOR

[75] Inventors: Shigeo Aoki, Habikino; Shuzo Isogami, Yao; Junichi Tamamura, Yao; Tatsuo Nagayoshi, Yao; Masaru Yasui, Yao; Susumu Hirao, Osaka, all of Japan

[73] Assignee: Hosiden Electronics Co., Ltd., Osaka, Japan

[21] Appl. No.: 237,163

[22] PCT Filed: Jun. 18, 1980

[86] PCT No.: PCT/JP80/00136
§ 371 Date: Feb. 12, 1981
§ 102(e) Date: Feb. 12, 1981

[87] PCT Pub. No.: WO80/02896
PCT Pub. Date: Dec. 24, 1980

[30] Foreign Application Priority Data

Jun. 20, 1979 [JP] Japan .................................. 54-78555

[51] Int. Cl.³ .............................................. B24B 1/00
[52] U.S. Cl. ................... 51/281 R; 310/312; 310/370; 29/25.35; 51/326; 51/165 R

[58] Field of Search ................. 51/165 R, 281 R, 319, 51/413, 326, 327; 29/25.35; 310/25, 311, 312, 370; 84/457; 368/167; 331/156; 219/121 LH, 121 LJ

[56] References Cited

U.S. PATENT DOCUMENTS 4,004,166 1/1977 Nakata .......................... 29/25.35 X

FOREIGN PATENT DOCUMENTS 52-122491 10/1977 Japan .

Primary Examiner—Harold D. Whitehead
Assistant Examiner—Steven P. Schad
Attorney, Agent, or Firm—Pollock, Vande Sande & Priddy

[57] ABSTRACT

For regulating the vibration frequency of a tuning-fork vibrator to a desired frequency, the tuning-fork vibrator is regulated so that its vibration frequency may become a frequency lower than the desired frequency by a predetermined value, and then the tuning-fork vibrator is regulated so that a difference between proper vibration frequencies of both legs of the vibrator may become smaller than a predetermined value, and further, the vibrator is regulated so that the desired frequency may be reached, while maintaining the difference in the proper vibration frequency smaller than the predetermined value. In this way, the desired frequency can rapidly be attained.

11 Claims, 14 Drawing Figures

METHOD FOR FREQUENCY REGULATION OF TUNING-FORK VIBRATOR

TECHNICAL FIELD

The present invention relates to a method for regulating the frequency of a piezo-electric tuning-fork vibrator.

TECHNICAL BACKGROUND

A tuning-fork vibrator, produced by cutting a piezoelectric material such as, for example, a crystal into a tuning fork configuration, may sometimes be incorporated in an oscillation circuit for obtaining a reference signal. Such a tuning-fork vibrator is usually mounted by supporting its base portion. When proper vibration frequencies of the two legs of the tuning fork are not equal to each other, that is, when they are not in equilibrium, a leakage oscillation develops in the base portion and if the base portion is supported with the vibration frequencies left unbalanced, the vibration frequency of the tuning fork deviates from its original vibration frequency and its Q is degraded. To avoid this, the tuning-fork vibrator has heretofore been supported softly to avert the influence of the support of the vibrator on its vibration frequency. Accordingly, when the tuning-fork vibrator is incorporated, for example, in a moving member, it has been difficult to obtain a support structure which supports the vibrator sufficiently even when subjected to a mechanical shock.

In view of the above, it has been proposed to correct imbalance of the vibration of the tuning-fork vibrator to thereby stabilize its vibration. With this method, since a leakage vibration develops in the base portion of the tuning-fork vibrator when its vibration is unbalanced, that is, when the proper vibrations of both legs are not in equilibrium, the leakage vibration is measured and, from an increase or decrease in the leakage vibration in the base portion, it is calculated predictively as to which one of the legs should be ground and how much, and then, based on the calculation results, grinding is conducted to bring the proper vibrations of both legs into agreement with each other.

The vibration frequency of the tuning-fork vibrator can be controlled by selecting the lengths of its legs; in general, the legs are formed in advance longer than a value which would yield a frequency desired to obtain and then the legs are ground shorter to approach the desired frequency. By the way, it is the general practice in the prior art to work the legs of the tuning-fork vibrator so that their proper vibration frequencies may be equal to each other or in equilibrium, that is, no leakage vibration may occur in the base portion and then to grind the both legs an equal length, thereby obtaining the desired frequency. In the case of such frequency regulation, if the proper vibration frequency of the vibrator prior to the working appreciably deviates from the desired frequency, even when the legs are correctly worked to reach the equilibrium state first and then they are each ground accurately by the same length, it may often happen, in practice, that the vibrator thus worked becomes unbalanced. The reason is that this method is based on the assumption that the vibrator is uniform all over and when the uniformity is lost, even if slightly, the equilibrium is destroyed in the process of making the vibration frequency of the vibrator approach the desired frequency after the equilibrium working.

In contrast to the foregoing, it has been considered to cut out a tuning-fork vibrator in a configuration which has an oscillation frequency as close to the desired frequency as possible and then subject it to equilibrium working to make the vibration frequency further approach the desired frequency. To perform this, it is necessary to cut out the vibrator so that its vibration frequency may be very close to the desired frequency but this requires a very high degree of accuracy; otherwise, the vibration frequency would become higher than the frequency desired to obtain, resulting in no frequency regulation becoming possible. Accordingly, in view of the actual manufacturing techniques that are presently available, it is not practical in terms of productivity and manufacturing costs to cut out first, with such high accuracy, a tuning-fork vibrator having a vibration frequency close to the desired frequency.

Further, it can also be considered to make the vibration frequency of the vibrator approach the desired frequency by performing the equilibrium working first and then checking whether the desired frequency is reached and, if not, effecting the equilibrium working again; but this method is defective in that the working time is long.

An object of the present invention is to provide a method for the frequency regulation of a tuning-fork vibrator by which the vibrator is cut out relatively simply so that its vibration frequency may be appreciably lower than a desired frequency and by which the tuning-fork vibrator can be adjusted correctly to the desired frequency and well-balanced.

DISCLOSURE OF THE INVENTION

According to the present invention, the vibration frequency of a tuning-fork vibrator to be regulated is measured first and both of its legs are equally worked until the vibration frequency becomes higher than a frequency which is lower than a desired frequency by a predetermined value, and then the legs are subjected to equilibrium working so that the amount of vibration of the base portion of the vibrator, that is, a leakage vibration may be reduced. The vibrator subjected to such equilibrium working is worked, with variations in the amount of vibration of the base portion held smaller than a predetermined value. As described above, the vibrator is worked first so that its vibration frequency may be raised from a relatively low frequency to a frequency a little lower than the desired frequency, that is, increased above a certain reference frequency; in this way, the abovesaid reference frequency is rapidly approached by working which is common to the both legs and relatively rough. Then the equilibrium working is performed and thereafter the desired frequency is gradually approached. Accordingly, since the difference between the desired frequency and the reference frequency is small, there is no fear that the equilibrium state will be destroyed during the equilibrium working steps used for approaching the desired frequency.

That a difference between individual proper vibration frequencies of the legs of the tuning-fork vibrator has become smaller than a predetermined value is detected by existence of a condition wherein a difference between the vibration frequency of the tuning-fork vibrator when its base portion is mechanically restrained and the vibration frequency when the base portion is released from such mechanical restraint becomes smaller than a predetermined value. Further, for detecting that the proper vibration frequencies of both legs have been brought into the equilibrium state, that is, the difference therebetween has been reduced to a value smaller than the predetermined value, the difference between the proper vibration frequencies is measured after working of each leg of the tuning-fork vibrator and the measured value is compared with a previously measured value; when the current value is smaller than the previous value, the leg that was worked latest is worked again and when the current value is larger than the previous value, the other leg is worked. Such operations are repeated until it is detected that the difference in the proper vibration frequency between the legs becomes smaller than the predetermined value, whereby to establish the equilibrium state. Alternatively, a minimum value of the difference in the proper vibration frequency is detected by similar operations to provide the equilibrium state, or a count is taken of the number of times of switching the working between the two legs and the state in which the count value exceeds a predetermined value is regarded as the equilibrium state.

MOST PREFERRED EMBODIMENTS OF THE INVENTION

Figure 1:
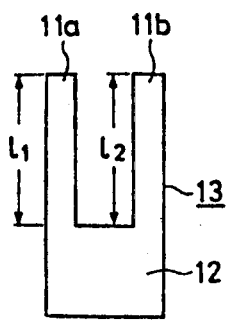
FIG. 1 is a front view showing a tuning-fork vibrator.

FIG. 1 shows a tuning-fork vibrator made of a piezoelectric material such, for example, a crystal, and its pair of parallel legs 11a and 11b are interconnected at one end through a base portion 12 to form a tuning-fork vibrator 13. In the case where the proper vibration frequencies of the legs 11a and 11b of the tuning-fork vibrator are equal to each other, no leakage vibration occurs in the base portion 12. Where there is a deviation between these proper vibration frequencies, however, a leakage vibration develops in the base portion 12 and consequently, if the base portion 12 is supported, the vibration frequency of the vibrator varies and its Q is degraded. The proper vibration of the legs 11a and 11b can be controlled by reducing their lengths $l_1$ and $l_2$. Accordingly, the vibrator is preformed so that the individual proper vibration frequencies may each be lower than a frequency desired to obtain, and then the legs are ground to attain the desired frequency.

Figure 2:
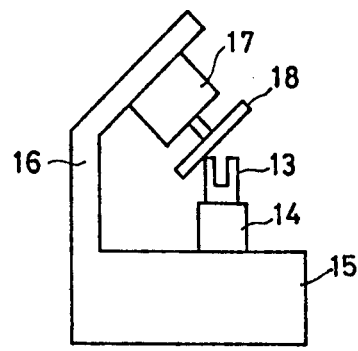
FIG. 2 diagrammatically illustrates an apparatus for working the tuning-fork vibrator.

FIG. 2 illustrates in a simplified form an apparatus for regulating the vibration frequency of the tuning-fork vibrator according to the present invention. The tuning-fork vibrator 13 is mounted on a support 14 and the support 14 is, in turn, mounted on a base 15 and a control unit and so forth are housed in the base 15. A motor 17 is mounted on an arm 16 extended from the base 15 and a grindstone 18 is affixed to the rotary shaft of the motor 17 so that the legs of the tuning-fork vibrator 13 may be ground by the grindstone 18 to adjust their lengths. The tuning-fork vibrator 13 can be rotated about the center axis between the legs 11a and 11b to permit grinding of the legs one by one.

Figure 3:
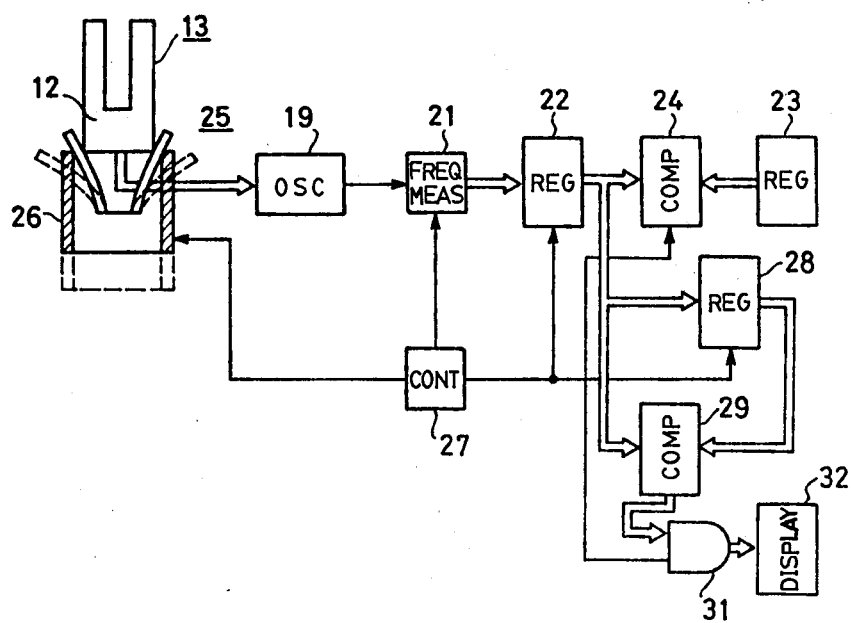
FIG. 3 is a block diagram of an electrical arrangement of the vibrator frequency regulating apparatus of the present invention.

The two legs 11a and 11b are each ground by the same length until the vibration frequency of the tuning-fork vibrator 13 becomes higher than a reference frequency. The reference frequency is preselected to be lower than a desired frequency by a certain value. An oscillation circuit 19 which employs, as an element for determining its oscillation frequency, the tuning-fork vibrator 13 is arranged as shown in FIG. 3. The oscillation frequency of the oscillation circuit 19 is measured by a frequency measuring circuit 21 and the measured value is applied to a register 22 and then compared by a comparison circuit 24 with the reference frequency set in a register 23. When the oscillation frequency of the oscillation circuit 19, that is, the vibration frequency of the tuning-fork vibrator 13 becomes equal to or higher than the abovesaid reference frequency, it is detected by the output from the comparison circuit 24.

Next, the tuning-fork vibrator 13 is subjected to equilibrium working or stabilization working. More particularly, the tuning-fork vibrator 13 is regulated so that its leakage vibration may be reduced smaller than a certain value. For this regulation, in this example, the tuning-fork vibrator is worked in such a manner as to decrease a difference between the vibration frequency when the base portion 12 of the vibrator 13 is mechanically restrained and the vibration frequency when it is released from such mechanical restraint. For instance, by urging a clamp ring 26 of a collet 25 against the vibrator 13 to clamp its base portion 12 and loosening the clamp, the base portion 12 is mechanically restrained and released from the restraint. The clamping by the collet 25 is controlled by a control circuit 27 and, in synchronism with the control, the measured value obtained by the frequency measuring circuit 21 is applied to the register 22 and, prior to it, the content of the register 22 is transferred to a register 28.

The contents of the registers 28 and 22 are compared by the comparison circuit 29. One of the contents of the registers 22 and 28 is the oscillation frequency of the oscillation circuit 19 when the base portion 12 of the vibrator 13 is mechanically restrained and the other is the oscillation frequency when the base portion 12 is not restrained and a difference therebetween is detected by the comparison circuit 29, the difference output from which is provided via a gate 31 to a display unit 32. The gate 31 is adapted to be opened by an output which is derived from the comparison circuit 24 when the vibration frequency of the vibrator 13 is equal to or higher than the reference frequency, as described previously.

When the difference between the vibration frequency when the restraint is applied and the vibration frequency when the restraint is removed is smaller than a predetermined value, the proper vibration frequencies of the legs 11a and 11b become substantially equal and the leakage vibration in the base portion 12 becomes smaller than a predetermined value. Next, the vibration frequency of the vibrator is made to approach the desired frequency while holding the leakage vibration of the base portion less than a certain value relative to the legs 11a and 11b.

For example, letting the proper vibration frequency of the vibrator 13 at the time of completion of the aforementioned equilibrium working, the desired vibration frequency and the measured frequency of the vibrator 13 be represented by $f_0$, $F_0$ and $f$, respectively, the legs of the vibrator are ground until $$\frac{f_0 + F_0}{2} - f$$

becomes sufficiently small in respect of one of the legs and until $f_0 - f$ becomes sufficiently small in respect of the other leg.

Figure 4:
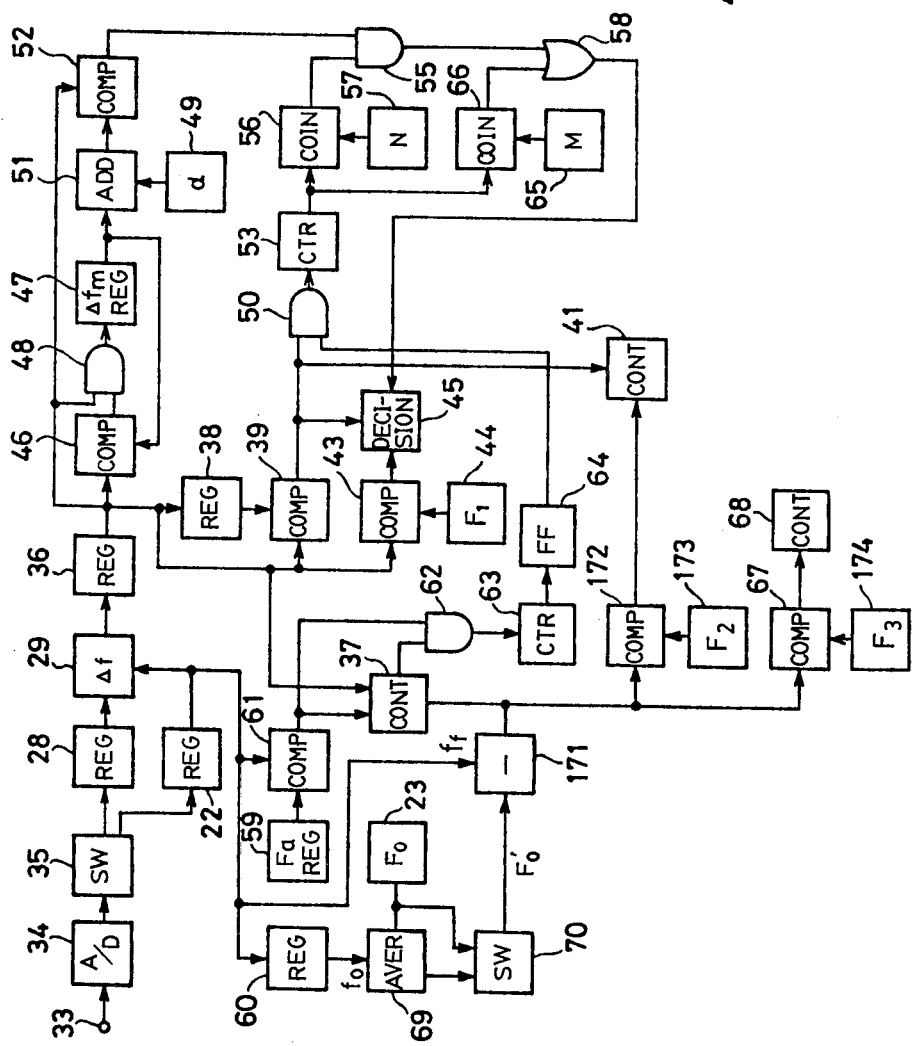
FIG. 4 is a block diagram illustrating a detailed example of the electrical arrangement of the apparatus of the present invention.

Next, a description will be given, with reference to FIG. 4, of a method for obtaining, with high accuracy, the proper vibration frequency $f_0$ of the vibrator 13 at the time of completion of the equilibrium working. From a terminal 33 in FIG. 4 is inputted the output electric signal from the oscillation circuit 19 which oscillates at a frequency determined by the crystal vibrator shown in FIG. 3. This signal is converted by an analog-to-digital converter 34 into a digital signal indicating that frequency. The digital signal is applied via a change-over circuit 35 to a register 22 to load therein a free vibration frequency $f_f$ at which the vibrator oscillates in a free state in which no restraint is imposed on its base portion 12, and thereafter a constrained vibration frequency $f_c$ of the vibrator in the state of its base portion 12 being mechanically restrained is loaded in a register 28.

A difference between the frequencies stored in these registers 22 and 28 is detected by a difference circuit 29 and the difference frequency $\Delta f$ is stored in a register 36. This $\Delta f$ is the variation and, in accordance with the magnitude of the $\Delta f$ loaded in the register 36, a control circuit 37 is controlled and the grinding of the vibrator 13 is controlled, for example, by controlling the revolving speed of the grindstone or its contact pressure and the time of its contact with the vibrator 13 depending on the magnitude of the $\Delta f$.

Further, this $\Delta f$ is compared by a comparator 39 with the previous $\Delta f$ stored in a register 38. As a result of the comparison of the current difference frequency $\Delta f_n$ with the previous difference frequency $\Delta f_{n-1}$ loaded in the register 38, if the current difference frequency $\Delta f_n$ is found to be smaller than the previous difference frequency $\Delta f_{n-1}$, the leg of the vibrator being ground currently is further ground. If the previous difference frequency $\Delta f_{n-1}$ is smaller than the current one $\Delta f_n$, a control circuit 41 is controlled by the output from the comparator 39 to rotate the support of the vibrator 13 and the other leg opposite to the leg currently ground is subjected to grinding. In this way, the $\Delta f$ is always controlled in a manner to approach a minimum value.

Figure 5:
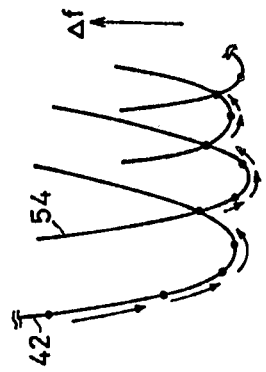
FIG. 5 is a graph showing variation characteristics of $\Delta f$.

That is, for example, as shown in FIG. 5, each measuring point shifts along the curve 42 in the direction of an arrow and the $\Delta f$ diminishes. Further, the current difference frequency $\Delta f_n$ is compared by a comparator 43 with a set value $F_1$ from a circuit 44 and when it is detected that the former is smaller than the latter, a first pass command is provided to a decision circuit 45.

Moreover, the current difference frequency $\Delta f_n$ in the register 36 is also supplied to a comparator 46 in which it is compared with the output $\Delta f_m$ from a minimum value register 47. As a result of this, if the output $\Delta f_n$ from the register 36 is smaller than the minimum value $\Delta f_m$, then a gate 48 is opened by the output from the comparator 46 and the $\Delta f_n$ from the register 36 is stored as the $\Delta f_m$ in the minimum value register 47 via the gate 48. If the $\Delta f_m$ is smaller than the $\Delta f_n$, then the gate 48 remains closed, retaining the previous minimum value $\Delta f_m$. In this way, a minimum one of the difference frequencies $\Delta f$ measured until then is stored as the $\Delta f_m$ in the register 47.

In an addition circuit 51 a certain value $\alpha$ from a circuit 49 is added to the $\Delta f_m$ of the minimum value register 47 to provide $\Delta f_m + \alpha$, which is supplied to a comparator 52 and compared therein with the current difference frequency $\Delta f_n$ from the register 36. When the output $\Delta f_n$ from the register 36 is detected to be smaller than $\Delta f_m + \alpha$, the comparator 52 yields a high-level output.

Further, when the output from the comparator 39 is inverted, the number of times of inversion is counted by a counting circuit 53. That is, the $\Delta f$ diminishes along the curve 42 as depicted in FIG. 5, but if grinding is further continued after a minimum value of the curve 42 is reached, then the $\Delta f$ increases. At this time, the current difference frequency $\Delta f_n$ from the register 36 becomes larger than the previous difference frequency $\Delta f_{n-1}$ from the register 38 and the output from the comparator 39 is inverted and this is counted by the counter 53 via a gate 50.

When the output from the comparator 39 is thus inverted, the leg of the vibrator 13 that is to be ground is switched by the control circuit 41 as described previously, so that the measured difference frequency $\Delta f$ starts to decrease again, as indicated by the curve 54. In a similar manner, when the $\Delta f$ passes through a minimum value of the curve 54 in FIG. 5, the output from the comparator 39 is inverted and this inversion is counted and, at the same time, the leg to be ground is switched. Thereafter, the same operation is repeated.

The number of times of switching between the legs is thus counted and the count value is compared by a coincidence circuit 56 with a predetermined value, that is, a value N set in a setting circuit 57. When the count value of the counter 53 is N and the output from the comparator 52 is high-level, the output from a gate 55 becomes high-level and this output is applied as a pass command to the decision circuit 45 via an OR gate 58.

In this case, an auxiliary reference frequency is provided and after the auxiliary reference frequency is reached, the abovesaid pass command is issued. That is, if the minimum value, namely, the equilibrium state is detected at a frequency appreciably lower than the vibration frequency $F_o$ which it is desired to obtain, then grinding of both legs by the same amount until the desired frequency is reached from that detected frequency introduces the possibility that the equilibrium between the two legs will be destroyed during the grinding. To avoid this, the minimum value, that is, the equilibrium state is detected after the auxiliary reference frequency is reached.

To this end, the auxiliary reference frequency $F_a$ is stored in a register 59 and this frequency is compared by a comparison circuit 61 with the frequency $f_f$ from the register 22 which is the frequency when the base portion is not restrained. In the case where the frequency $f_f$ of the vibrator to be regulated does not reach the auxiliary reference frequency $F_a$, the control circuit 37 is controlled by the output from the comparison circuit 61 to effect grinding of the vibrator.

When the frequency $f_f$ of the crystal vibrator with no restraint imposed on its base portion becomes higher than or equal to the auxiliary reference frequency $F_a$, the output from the comparison circuit 61 is inverted to a high-level output, by which an AND gate 62 is opened to detect coincidence with the output from the control circuit 37 and it is counted by a binary counter 63. When the counter 63 counts 2 in this state, its output inverts a flip-flop 64, by the output from which the AND gate 50 is opened. From this state, counting of the inversion of the output from the comparator 39 by the counter 53 is started.

If an extremely small $\Delta f$ is obtained by a first measurement, then it happens that no $\Delta f$ smaller than the $\Delta f_m + \alpha$ can be obtained in the register 36 in the subsequent measurements and the output from the comparator 52 does not become high-level. In other words, no pass commands can be yielded. To avoid this, a value M set in a setting circuit 65 and the count value of the counter 53 are compared by a coincidence detection circuit 66 and, in the case of coincidence, a pass command is applied by its output to the decision circuit 45 via the OR gate 58.

The output from the comparator 39 is also supplied to the decision circuit 45 and in the case where the current measured value $\Delta f_n$ from the register 36 is larger than the previous measured value $\Delta f_{n-1}$, it is rejected even if other conditions are fulfilled. That is, any one of or a combination of the facts that the $\Delta f$ is smaller than the fixed value $F_1$ in the comparator 43, that the count value of the counter 53 coincides with the set value N, and that the count value of the counter 53 coincides with the set value M, is decided to be acceptable as a pass, but when it is detected by the comparator 39 that the current measured value $\Delta f_n$ is larger than the previous measured value $\Delta f_{n-1}$, it is decided to be rejected.

It is also possible to omit the counter 53 and make a pass decision in the state in which the output from the comparator 52 is obtained, but in such a case it is necessary to satisfy the requirement at the output of the comparator 43 and the requirement in the comparator 39 that the current measured value is smaller than the previous one.

In this way, the variation, that is, the minimum value of the difference $\Delta f$ between the frequencies when the base portion of the vibrator is restrained and when it is not restrained, is detected. Then, the crystal vibrator is ground to reach the desired frequency $F_o$ while retaining the difference frequency without substantial change. To accomplish this, the free vibration frequency when the base portion is not restrained in the case of the variation being decided as minimum is set as $f_o$ in the register 60 from the register 22. The desired frequency $F_o$ prestored in a setting circuit 23 and the frequency $f_o$ are averaged by an averaging circuit 69; namely, $$F_0' = \frac{f_0 + F_0}{2}$$

is calculated.

To a switching circuit 70 are applied the outputs $F_o'$ from the averaging circuit 69 and $F_o$ from the setting circuit 23 and, at first, the averaged value output $F_o'$ is supplied to a subtraction circuit 171, wherein there is calculated a difference, $F_o' - f_f$, between it and the output measured when the base portion was not restrained, that is, the output $f_f$ from the register 22. In accordance with the subtracted output, the control circuit 37 is controlled, effecting control of grinding of the vibrator.

The output from the subtraction circuit 171 is compared by a comparator 172 with a reference value $F_2$ from a circuit 173 and when the former is smaller than the value $F_2$ the control circuit 41 is controlled by the output from the comparator 172 to control the switching circuit 70 and the target value $F_o$ is derived as the output therefrom and a difference between it and the $f_f$ from the register 22 is detected by the circuit 171. This output and a reference value $F_3$ from a circuit 174 are compared in a comparison circuit 67 and when the output from the difference circuit 171 becomes smaller than the reference value $F_3$, a control circuit 68 is controlled by the output from the comparison circuit 67, putting an end to the overall process.

Since the regulation and control for preventing the variation from substantial fluctuation are always repeated, even if the region of a minimum value of the variation is narrow, a correct minimum value can be detected in a short time.

Further, not only the variation below a certain value is decided as a minimum value but also it is decided that the variation has passed through the minimum value and, in addition, the minimum value is used as a reference, so that even in the case of scattered minimum value characteristics, the variation can always be regulated to the minimum value. In the case where it is checked, before regulation to the minimum value, whether the auxiliary reference value $F_a$ has been reached or not and the vibrator is worked to the value $F_a$ close to the target value first and then the minimum value is detected, as in the above embodiment, the regulation after the minimum value is reached, that is, the working time for approaching the target value after both legs are equilibrated is short and the amount of working is also small and the minimum value of the variation is not likely to undergo substantial changes. Moreover, the control for adjusting the variation to the minimum value and the control for adjustment to the target value after the minimum value is reached may be arranged entirely separately of each other. Besides, the difference between the vibration frequencies in the cases of the base portion of the tuning-fork vibrator being restrained and not restrained is used as the variation, but it is also possible to detect, as the variation, the magnitude of the leakage vibration of the base portion.

Grinding apparatus for grinding the crystal vibrator to regulate it for balancing its legs can be constituted, for example, by the following arrangement.

Figure 6:
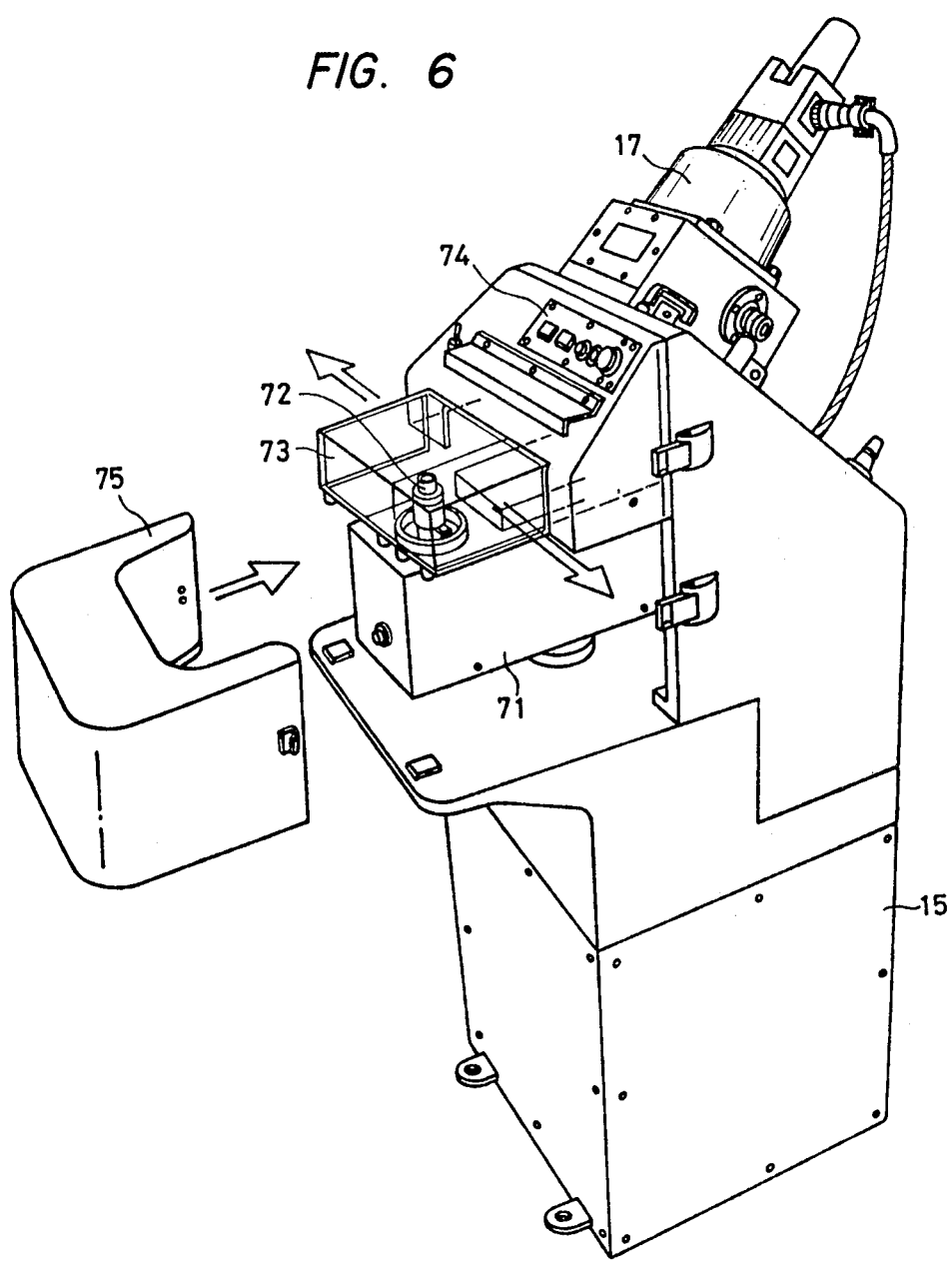
FIG. 6 is a diagram showing the external appearance of an example of an automatic vibrator grinding apparatus.

As shown in FIG. 6, a rotary box 71 is rotatably mounted on a base 15. On both end portions of the rotary box 71 are respectively provided workpiece holding mechanisms 72 (one of which is not seen in FIG. 6) and a sound insulating cover 73 for noise insulation, which covers the holding mechanism 72, can be mounted on the rotary box 71. A panel 74 is provided on an extension part which extends from the base 15 to lie above the rotary box 71. On the panel 74 on the side of the base 15 is positioned that one of the holding mechanisms (which is not seen in the drawing) and a grindstone employed as a tool is dispersed opposite a workpiece held by that holding mechanism, that is, a vibrator, though not shown, and a motor 17 for rotating the grindstone is provided on the extension part of the base 15 on the opposite side from the part. Further, the holding mechanisms 72 and the rotary box 71 projecting from the panel 74 can be covered with a panel cover 75, as required.

Figure 7:
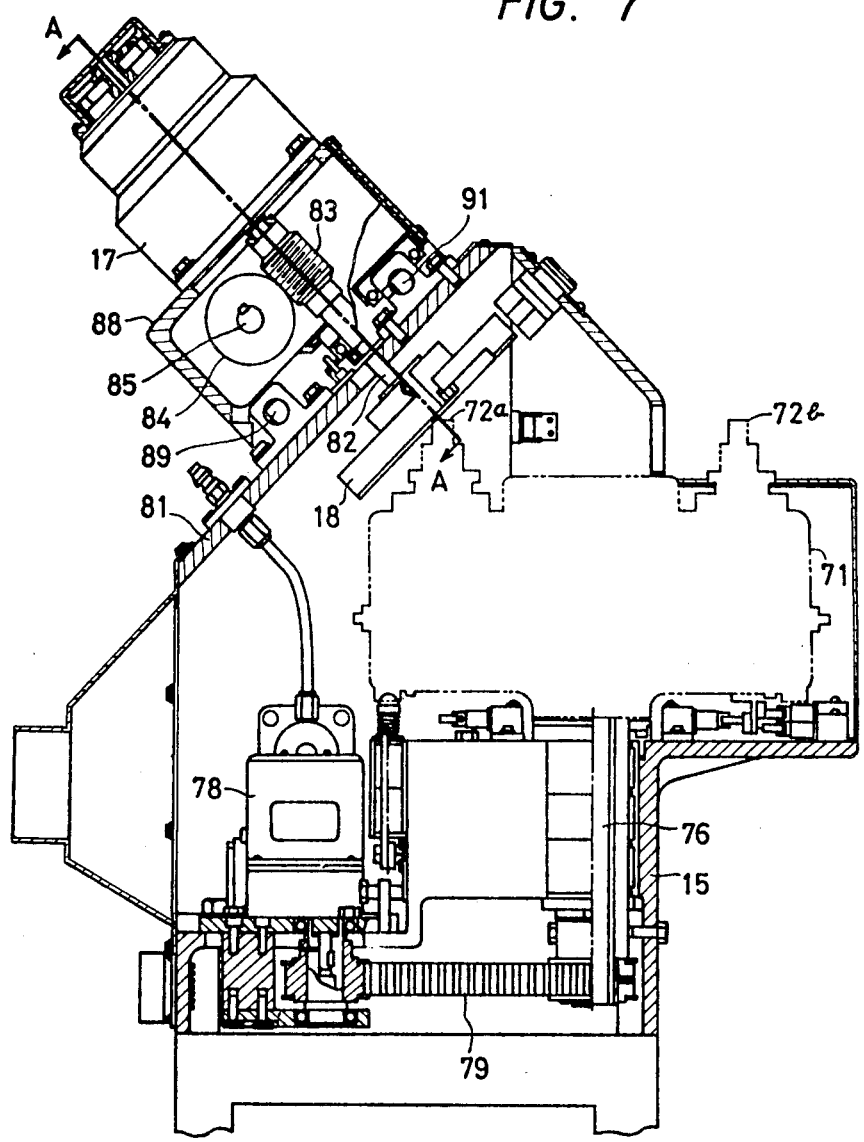
FIG. 7 is a sectional view of a specific example of FIG. 6.

The rotary box 71 is affixed to a rotary support shaft 76 which is rotatably supported to project upwardly from the base 15, as depicted in FIG. 7. A motor 78 in the base 15 and the support shaft 76 are coupled by a chain 79 to rotate the rotary box 71 by driving of the motor 78.

An inclined base plate 81, which is inclined, for instance, at an angle of 45°, extends from the base 15 obliquely above the rotary box 71 and a shaft 82 is passed through the inclined base plate 81 substantially at right angles thereto and a diamond wheel, that is, the grindstone 18 is mounted at one end of the shaft 82 on the side of the rotary box 71. The other end of the shaft 82 is coupled with the rotary shaft of the motor 17.

Figure 8:
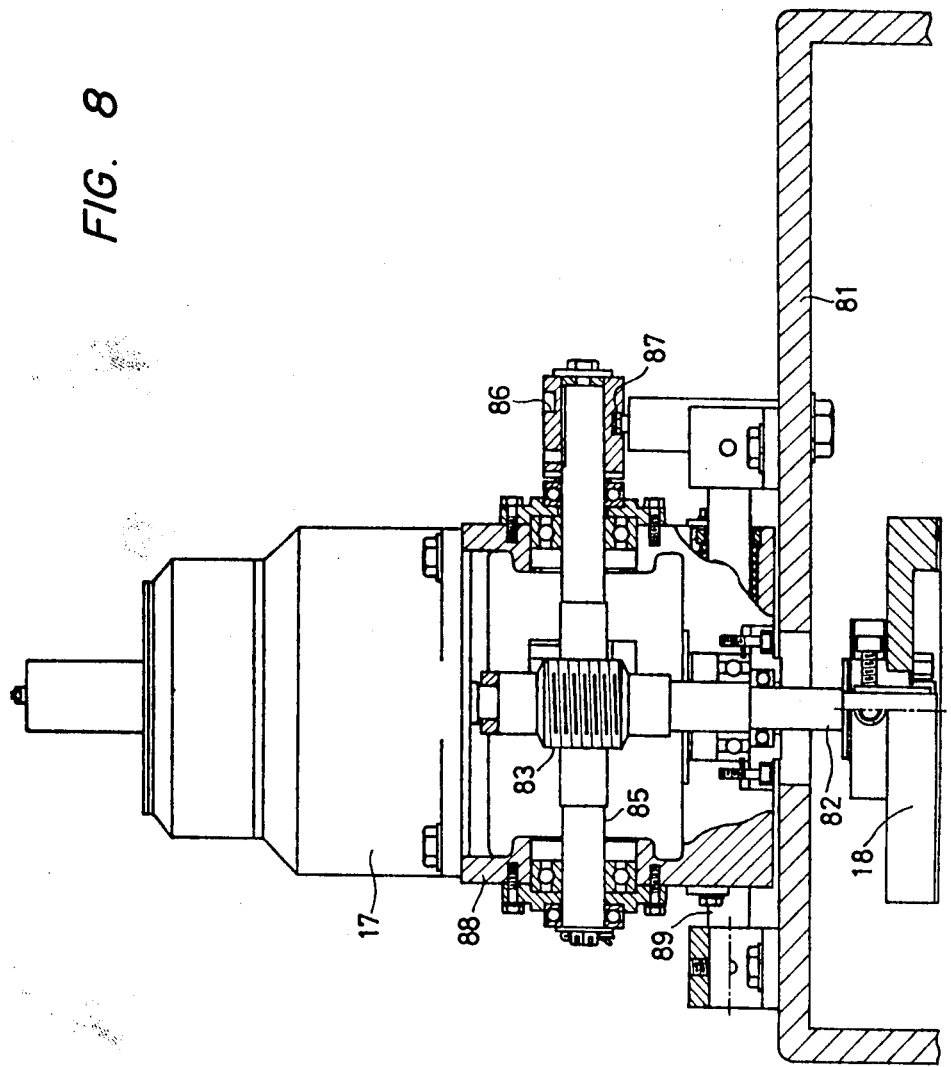
FIG. 8 is a sectional view taken on the line A—A in FIG. 7.
Figure 9:
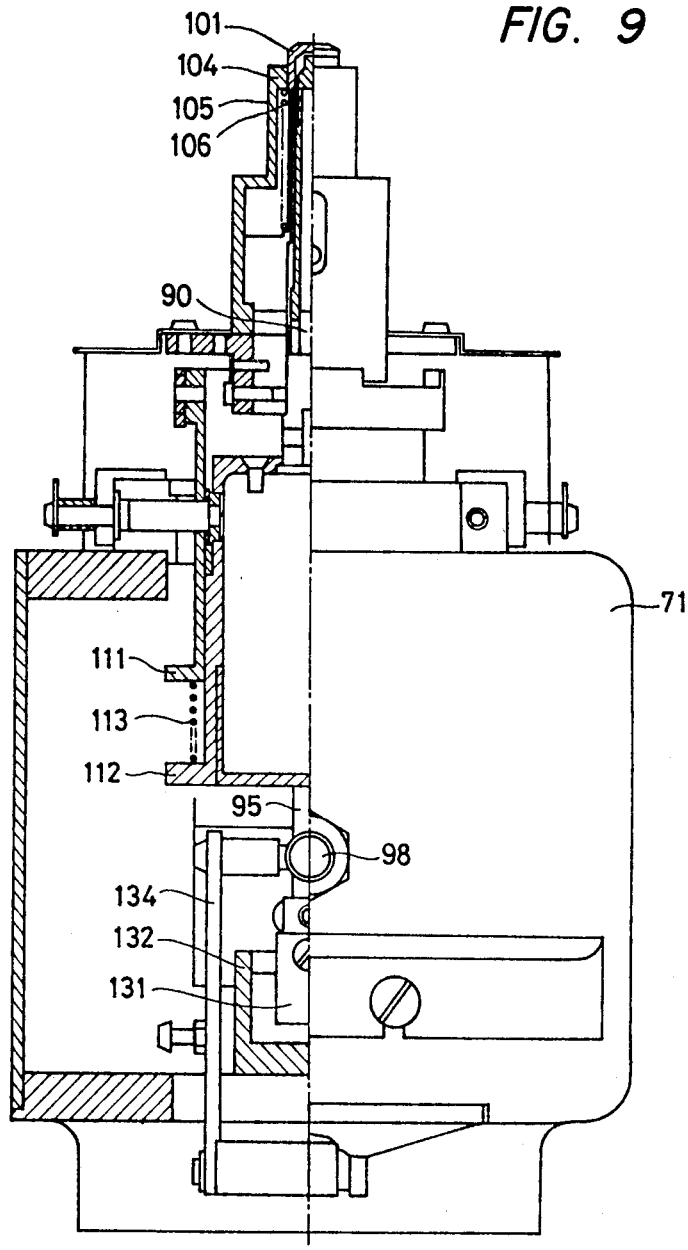
FIG. 9 is a diagram showing a part of a section on the line B—B in FIG. 7.

This example is arranged so that as the grindstone 18 rotates, the grindstone 18 is reciprocated in a direction perpendicular to its rotary shaft. That is, as shown in FIGS. 7 and 8, a gear 83 is formed on the shaft 82 and a gear 84 is meshed with the gear 83 and, as shown in FIG. 8, a cam groove 86 which is oblique to a shaft 85 of the gear 84 is formed in the peripheral surface of one end portion of the shaft. In the cam groove 86 is inserted a pin 87 which is fixed to the inclined base plate 81.

The shaft 85 is rotatably held in a gear box 88 and the motor 17 is fixed to the gear box 88 and the gear box 88 is adapted to be guided by a pair of guide shafts 89 and 91 provided on the inclined base plate 81 so that it moves along the inclined base plate 81. By the rotation of the motor 17, the cam 86 is rotated through the gears 83 and 84 and since the pin 87 is fixed, the cam shaft 85 moves in its axial direction and consequently the gear box 88 and the motor 17 are guided by the guide shafts 89 and 91 to move. That is, the shaft is reciprocated by the rotation of the cam groove 86.

Figure 11:
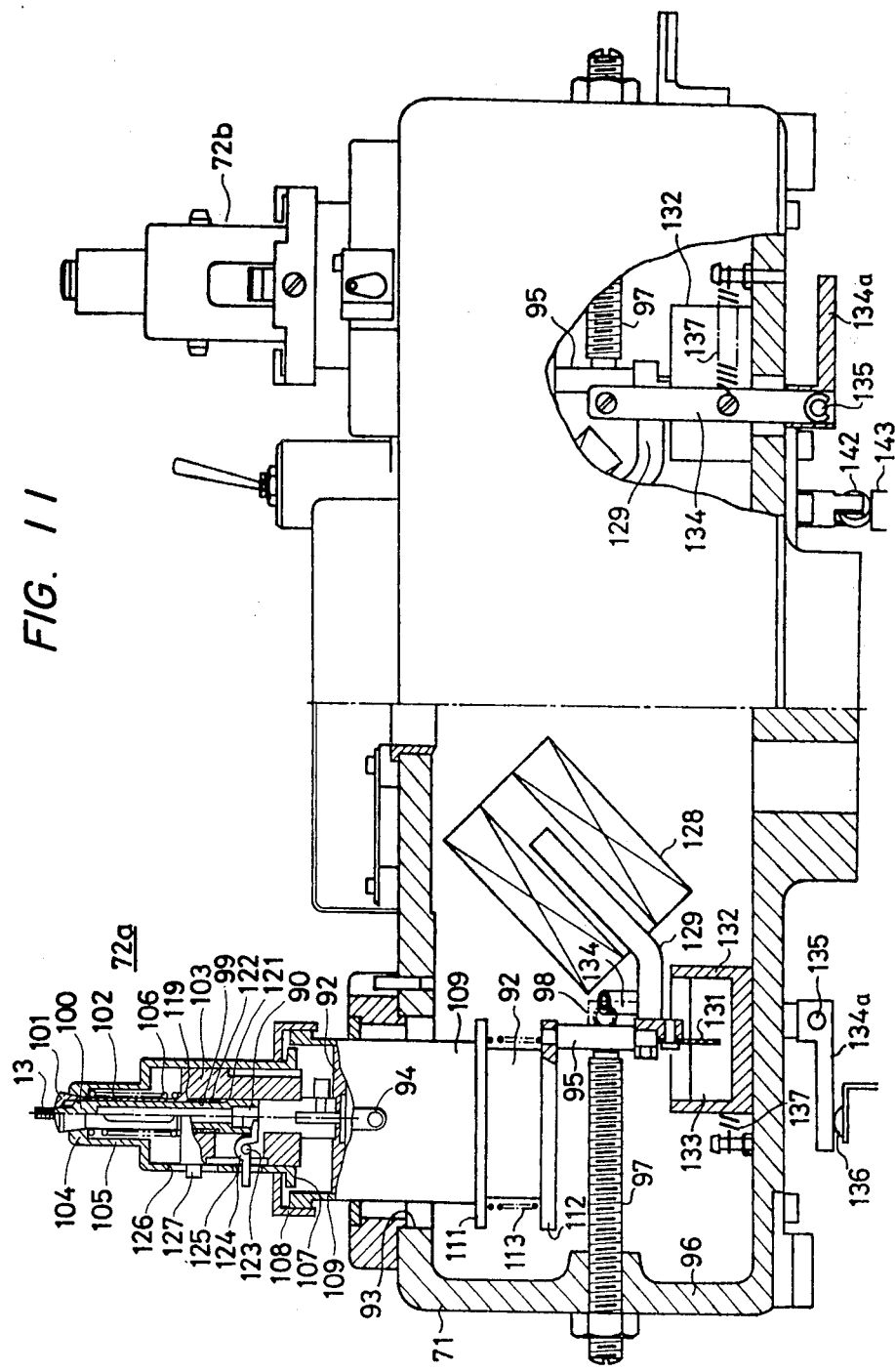
FIG. 11 is an enlarged sectional view of a rotary box.

The workpiece holding mechanism 72 consists of two mechanisms 72a and 72b and, as shown in FIG. 11 with respect to the mechanism 72a, a holder 92 partly projects out from a hole 93 of a top panel of the rotary box 71 and the holder 92 is supported in a manner to be rotatable about a shaft 94 provided in the rotary box 71. At the inner end of the holder 92 a projecting piece 95 projects towards the base 15 and the projecting piece 95 is held between the end face of a stopper 97 attached to a side panel 96 of the rotary box 71 and a movable stopper 98.

Figure 12:
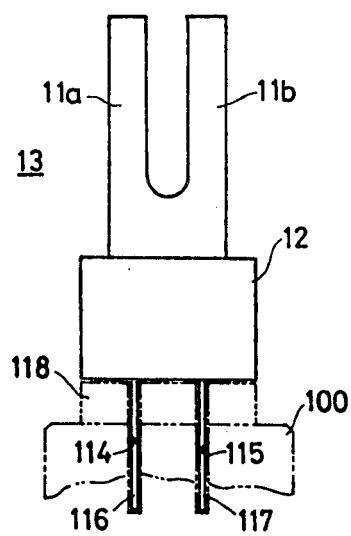
FIG. 12 is a sectional view showing a vibrator mounted on a support.

In the holder 92 is incorporated a motor, though not shown, and its motor shaft 90 projects towards the inclined base plate and a tubular member 99 is mounted on that motor shaft 90 to extend therefrom so that it makes rotary engagement therewith and is slidable thereon in its axial direction. On the outside of the tubular member 99 are disposed a plurality of collet pawls 101 and these collet pawls 101 are positioned so that they can hold, for example, the base portion 12 of the tuning-fork vibrator 13, disposed therebetween. The collet pawls 101 are attached to one end of a springy support piece 102 and the other end of the support piece 102 is fixed to a base 103. Due to its springy property the support piece 102 biases the collet pawls 101 outwardly of each other, that is, in a direction in which they deviate from the base portion 12. The outer surfaces of the collet pawls 101 are tapered to turn away outwardly from each other as the upper side of the vibrator 13 is approached. The upper end portion of the tubular member 99 forms a holding member 100 and the vibrator 13 is held by the holding member 100. That is, for example, as shown in FIG. 12, conducting pipes 114 and 115 are buried in the holding member 100 to extend from its end face in its axial direction and the vibrator 13 is held by the holding member 100, with leads 116 and 117 led out from the bottom of the base portion 12 of the vibrator being inserted into the pipes 114 and 115. It is desirable that a leak preventive layer 118 as of silicone rubber for preventing sound leakage is mounted on the vibrator holding surface of the holding member 100. The mounting of the holding member 100 will be described later.

In FIG. 11, on the outside of the collet pawls 101 is disposed coaxially therewith a clamp ring 104. The clamp ring 104 is formed on a movable cylinder 105 as a unitary structure therewith in the shape of a flange on the inside thereof. The inner surface of the ring is tapered so that its diameter decreases as it goes away from the vibrator 13 and this surface is adapted to match with the tapered outer surfaces of the pawls 101.

In the movable cylinder 105 a coiled spring 106 is wound around the support piece 102 between the clamp ring 104 and the base 103 and, by the coiled spring 106, the clamp ring 104 is biased towards the vibrator 13, that is, upwardly in FIG. 11, by which the collet pawls 101 are urged inwardly to press the outer peripheral surface of the base portion 12 substantially uniformly by the inner surfaces of the pawls 101.

In this way, a force can be applied to the base portion 12 uniformly substantially all over the outer peripheral surface thereof. On the outside of the other end of the movable cylinder 105 is formed integrally therewith an engaging flange 107 and a drive ring 108 is disposed coaxially with the flange 107 in opposing relation thereto on the side of the collet pawls 101. The drive ring 108 is attached to one end of a drive cylinder 109 and a marginal flange 111 is formed as a unitary structure with the other end of the drive cylinder 109. The drive cylinder 109 is movably engaged with the holder 92 coaxially therewith. A marginal flange 112 on the bottom end of the holder 92 is disposed in opposing relation to the marginal flange 111. Between the marginal flanges 111 and 112 a coiled spring 113 is wound around the holder 92 and the marginal flange 111 is biased by the spring 113 towards the side of the collet pawls 101. Accordingly, the drive ring 108 is disengaged from the engaging flange 107 and the movable cylinder 105 is moved by the action of the spring 106 towards the side of the collet pawls 101 and, as a result, the collet pawls 101 are clamped by the clamp ring 104.

When the drive cylinder 109 is pressed down by the marginal flange 111 against the biasing force of the coiled spring 113 to approach the side of the marginal flange 112, the drive ring 108 engages with the engaging flange 107 to pull down the movable cylinder 105 to withdraw it from the collet pawls 101 and the collet pawls 101 are opened by the spring action of the support piece 102 to release the base portion 12 of the vibrator 13 from the restraint thereon.

The base portion 12 of the vibrator is fixed to the holder 92 and the tubular member 99 of the holding member 100 is inserted into a central hole of the base 103. The lower half portion of the inner peripheral surface of the base 103 is increased in diameter to form a stepped portion 119 and the outer diameter of the tubular member 99 below the stepped portion 119 is increased to form another stepped portion 121. Between these stepped portions 119 and 121 a coiled spring 122 is wound around the tubular member 99 and the holding member 100 is biased downwardly by the action of the spring 122.

Further, a rotary shaft 123 is provided in a lateral hole made in the intermediate portion of the base 103 and a rotary lever 124 is mounted on the shaft 123. One end of the rotary lever 124 is inserted into a hole made in the tubular member 99 to engage therewith. The other end of the rotary lever 124 projects out from a hole 125 of the movable cylinder 105.

In the case where the movable cylinder 105 has been moved by a distance necessary for merely removing the restraint imposed on the base portion 12 by the collet pawls 101, the rotary lever 124 does not engage with the top end of the hole 125. When the movable cylinder 105 has been further pulled down towards the holder 92, however, the rotary lever 124 engages with the top end of the hole 125 and the rotary lever 124 rotates anticlockwise in the drawing, by which the holding member 100 moves away from the holder 92 and the base portion 12 projects upwardly of the collet pawls 101, permitting the tuning-fork vibrator 13 to be dismounted easily.

An elongated hole 126 is made in the movable cylinder 105 to extend in its axial direction and a stopper pin 127 fixed to the peripheral surface of the base 103 projects out from the elongated hole 126. By the pin 127 and the elongated hole 126 is limited the range of movement of the movable cylinder 105.

A contact mechanism is provided by which the vibrator 13 held by the holding structure is brought into contact with the grindstone 18. A damper mechanism is additionally provided for alleviating shock resulting from the contact. That is, as depicted in FIG. 11, in the rotary box 71 the projecting piece 95 projecting from the holder 92 towards the base 15 is coupled with a plunger 129 of a plunger solenoid 128. The projecting piece 95 is fixed to the plunger 129 and a resistance plate 131 is fixed to an extension of the projecting piece. The resistance plate 131 is inserted into a body of damper oil, for example, silicone oil 133 which is housed in a container 132 mounted in the rotary box 71.

The movable stopper 98 is coupled with one end of a rotary arm 134 and the rotary arm 134 projects out from a bottom panel of the rotary box 71 and is adapted to be rotatable about a shaft 135. At the position of the shaft 135 the rotary arm 134 is bent and when its bend portion 134a is rotated clockwise in FIG. 11, the rotary arm 134 rotates to withdraw the movable stopper 98 from the projecting piece 95. Accordingly, upon energization of the plunger solenoid 128 in that state, the plunger 129 moves back to rotate the motor holder 92 about the shaft 94 and, as a result of this, the vibrator 13 is brought into contact with the grindstone 18.

This contact is gradually made without shock through the action of the resistance plate 131 and the damper oil 133. By aligning the center line between the two legs of the vibrator 13 held by the holding member 100 with the axis of the shaft 90 of the motor disposed in the holder and by rotating the motor shaft 90 through 180°, both legs of the vibrator 13 can be contacted with the grindstone 18 under the same condition and both legs can be ground by the same amount. When the rotary box 71 is rotated to place the vibrator 13 opposite the grindstone 18, the bent portion 134a of the rotary arm 134 corresponding to the holding structure 72a holding the vibrator 13 engages with a projection 136 fixed on the base 15 to perform the clockwise rotation. In connection with the rotary arm 134 for the holding mechanism 72b which is not engaged with the grindstone 18, however, such projection 136 is not provided on the base 15 opposite the bent portion 134a. Accordingly, this holding structure 72b is held stably by the stoppers 97 and 98. In order that the movable stopper 98 may automatically be restored, a coiled spring 137 is provided between the rotary arm 134 and a projection mounted on the bottom panel of the rotary box 71, as shown on the side of the holding structure 72b in the drawing, by which the rotary arm 134 is automatically restored.

The drive cylindrical member 109 is biased by the spring 113 upwardly of the holder 92, that is, in the direction in which it projects out from the rotary box 71. Accordingly, the drive cylindrical member 109 is pushed up and the drive ring 108 also lies in its raised position to clamp the collet pawls 101 by the action of the spring 106.

Figure 10:
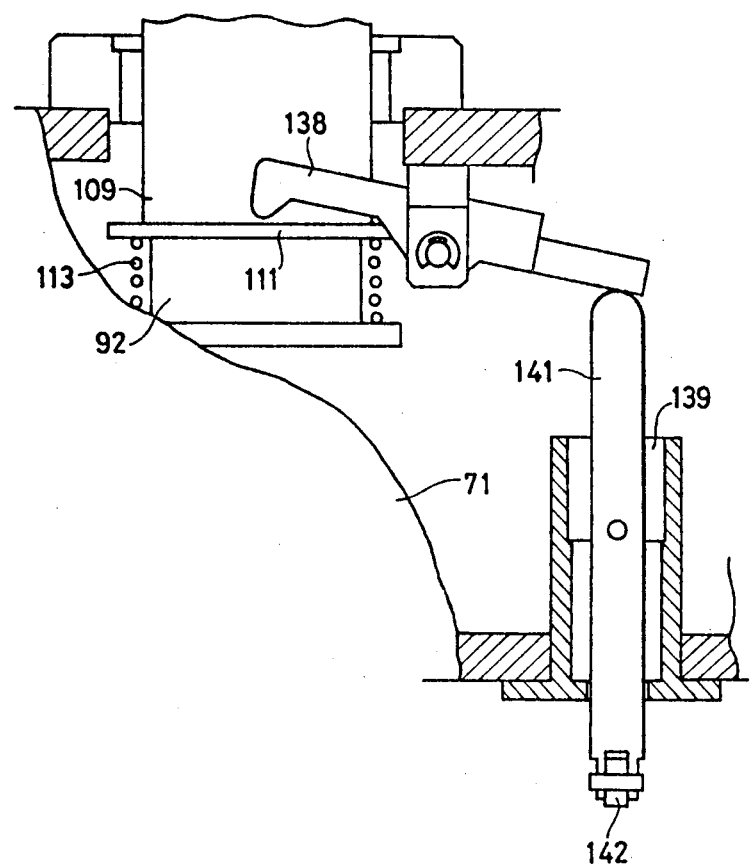
FIG. 10 is a diagram showing an example of a vibrator driving portion of a support structure.

As depicted in FIG. 10, in the rotary box 71 an intermediate portion of a press lever 138 is rotatably attached to its top panel and one end portion of the lever is disposed opposite the upper surface of the flange 111 of the drive cylindrical member 109. A push rod 141 projects out from the bottom panel of the rotary box 71, guided by a guide member 139 in a manner to be movable up and down, and the other end portion of the press lever 137 is positioned above the upper end of the push rod 141. To the lower end of the push rod 141 is rotatably attached a roller 142.

In the holding mechanism 72b which is not disposed opposite the grindstone 18, as shown in FIG. 11, the roller 142 rides on a relatively large projection of the base 15. Consequently, the push rod 141 moves up to rotate the press lever 138 counterclockwise in FIG. 10, by which the flange 111 is greatly pressed down to pull down the drive cylindrical member 109. In consequence, as described previously, the movable cylinder 105 is also greatly pushed down to release the clamping of the collet pawls 101 and, at the same time, the tubular member 99 and the holding member 100 are pushed up, permitting easy removal of the vibrator 13. In the holding mechanism 72a disposed opposite the grindstone 18, however, since the projection on which the roller 142 runs is lower than that on the side of the holding mechanism 72b, it is possible to achieve only the control for opening and closing the collet pawls 101 without rotating the rotary lever 124.

Figure 14:
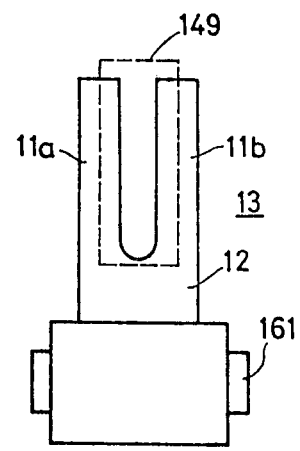
FIG. 14 is a diagram showing the relationships between the legs of the vibrator and a slit 149.
Figure 13:
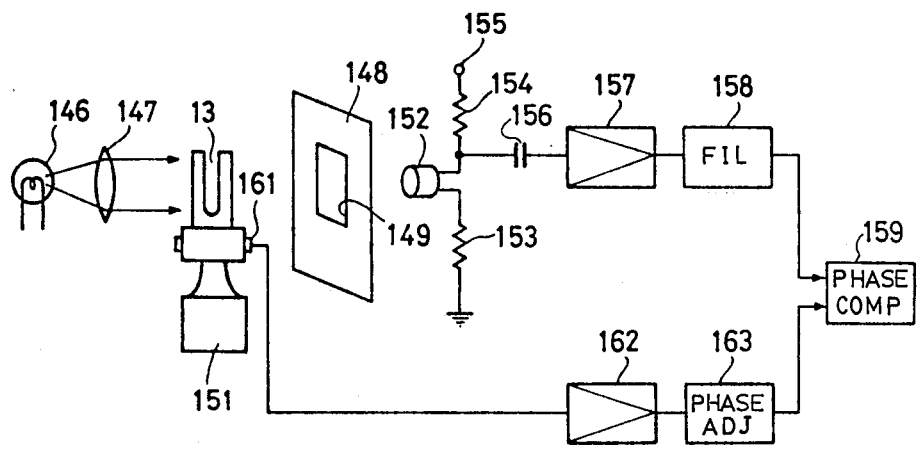
FIG. 13 is a block diagram illustrating an example of a device for measuring which one of legs of the vibrator is larger in proper vibration than the other.

For the regulation of the vibrator, it is necessary to know which one of the legs 11a and 11b is higher in proper vibration. To this end, as depicted in FIG. 13, a tungsten lamp or the like is used as a light source 146 and light from the light source 146 is rendered by a lens 147 into parallel rays and applied to the vibrator 13 at right angles to the direction of elongation of the legs 11a and 11b. A light shield plate 148 is disposed on the opposite side from the light source 146 with respect to the vibrator 13, the light shield plate 148 having formed therein a slit 149. The slit 149 and the legs 11a and 11b of the vibrator bear a relationship such as shown in FIG. 14, wherein when they are viewed from the direction perpendicular to the direction of elongation of the legs, they overlap and in the case where the vibrator 13 is vibrated by an exciter 151, when the legs 11a and 11b are close to each other, transmitted light passing through the slit 149 decreases, whereas when the legs 11a and 11b are opened relative to each other, the transmitted light increases. In this way, the amount of light transmitted through the slit 149 varies in accordance with the open-close vibration of the legs 11a and 11b. The light having passed through the slit 149 is received by a photoelectric conversion element 152 for conversion into an electric signal. As the photoelectric conversion element 152, use can be made of, for instance, a photo transistor and its emitter side is grounded via a resistor 153 and the collector side is connected via a resistor 154 to a power source terminal 155 and, at the same time, the DC component is cut off by a capacitor 156 to take out only the AC component. That is, an AC oscillation representative of the open-close vibration of the legs 11a and 11b is taken out.

This electric signal of the open-close vibration is amplified by an amplifier 157 and, further, unnecessary components are removed by a filter 158 to take out the open-close vibration component alone, which is supplied to a phase comparator 159. On the other hand, a piezo-electric element 161, for instance, is mounted on one side of the legs 11a and 11b adjacent the base portion 12 of the vibrator 13, by which an unbalanced vibration of the base portion of the vibrator 13 is detected as an electric signal. This detected output is provided via an amplifier 162 to the phase comparator 159, wherein it is phase-compared with the open-close vibration from the amplifier 157. A phase adjuster 163, which is inserted in one of the two signal paths, is adjusted so that the phase difference between the open-close vibration and the unbalanced vibration, which are detected regardless of measurement errors and the characteristics of the amplifiers 157 and 162, may be in phase or out of phase with each other.

It is already known that when the comparison result of the phase comparator 159 is in-phase, the proper vibration of the leg, for instance, 11b is higher in frequency than the proper vibration of the leg 11a, whereas in the case of the comparison result being out-of-phase, the proper vibration of the leg 11b is lower in frequency. Accordingly, the output from the phase comparator 159 can be used to detect which one of the legs 11a and 11b is higher in the proper vibration frequency than the other. It is possible to similarly detect which one of the legs is higher or lower in the proper vibration frequency than the other in a magneto-strictive tuning-fork vibrator as well as in a piezo-electric vibrator. In this way, it can be detected, without working the legs of the vibrator, which one of them is higher in the proper vibration frequency than the other.

We claim:

1. A method for frequency regulating a two-legged tuning-fork vibrator, comprising a first step of working said tuning-fork vibrator so that its vibration frequency becomes higher than a reference frequency which is lower than a desired frequency by a predetermined value; a second step of detecting a difference between a constrained vibration frequency produced by the vibrator when a mechanical restraint is imposed on a base portion of said tuning-fork vibrator and a free vibration frequency produced when the restraint is removed, and working said tuning-fork vibrator so as to reduce said difference; and a third step of working said tuning-fork vibrator so that its vibration frequency reaches said desired frequency, while said difference between said constrained and free vibration frequencies is maintained at a value smaller than a certain value.

2. A method for frequency regulating a tuning-fork vibrator according to claim 1 wherein, in said second step, said difference between the free vibration frequency and the constrained vibration frequency of the tuning-fork vibrator is measured for each working of one of the legs; said measured value is compared with a previous such measured value; when the currently measured value is smaller than the previously measured value, the leg being worked is further worked and when the currently measured value is larger than the previously measured value, the other leg is worked; the same operations are repeated; and when it is detected that said difference has become smaller than a predetermined value, the second step is terminated.

3. A method for frequency regulating a tuning-fork vibrator according to claim 1 wherein, in said second step, said difference between the free vibration frequency and the constrained vibration frequency of the tuning-fork vibrator is measured for each working of one of the legs; said measured value is compared with a previous such measured value; when the currently measured value is smaller than the previously measured value, the leg being worked is further worked and when the currently measured value is larger than the previously measured value, the other leg is worked; the same operations are repeated; and when a minimum value of said difference in the proper vibration frequency is detected, the second step is terminated.

4. A method for frequency regulating a tuning-fork vibrator according to claim 3 wherein the number of times of switching the working between the legs is counted and after the count value has become larger than a first predetermined value, the second step is terminated when the abovesaid minimum value is detected.

5. A method for frequency regulating a tuning-fork vibrator according to claim 4 wherein in the case where the abovesaid minimum value is not detected, the second step is terminated when it is detected that the said count value has become larger than a second predetermined value which is larger than the said first predetermined value.

6. A method for frequency regulating a tuning-fork vibrator according to claim 1 wherein, in said second step, said difference between the free vibration frequency and the constrained vibration frequency of the tuning-fork vibrator is measured for each working of one of the legs; said measured value is compared with a previous such measured value; when the currently measured value is smaller than the previously measured value, the leg being worked is further worked and when the currently measured value is larger than the previously measured value, the other leg is worked; the same operations are repeated; the number of times of switching the working between the legs is counted; and when it is detected that the count value has become larger than a predetermined value, the second step is terminated.

7. A method for frequency regulating a tuning-fork vibrator according to any one of claims 2, 3, 5 or 6 wherein when the current measured value is larger than the previous one, the second step is not terminated.

8. A method for frequency regulating a tuning-fork vibrator according to claim 1 wherein in said second step, said difference between the free vibration frequency and the constrained vibration frequency of the tuning-fork vibrator is measured for each working of one of the legs; said measured value is compared with a previous such measured value; when the currently measured value is smaller than the previously measured value the leg being worked is further worked and when the currently measured value is larger than the previously measured value the other leg is worked; the same operations are repeated; and when both said difference becomes smaller than a predetermined value and a minimum value of said difference is detected, said second step is terminated.

9. A method for frequency regulating a tuning-fork vibrator according to claim 4 wherein when the currently measured value is larger than the previously measured value, said second step is continued.

10. A method for frequency regulating a tuning-fork vibrator according to any one of claims 2, 3, 5, 6, 1, 8 or 9 wherein the third step consists of obtaining an average value of the desired frequency and the vibration frequency produced by the tuning-fork vibrator when said second step is completed; working the tuning-fork vibrator in accordance with the difference between said average value and the vibration frequency of the tuning-fork vibrator so that the difference may be reduced; detecting that the difference between the average value and the vibration frequency of the tuning-fork vibrator has become smaller than a predetermined value; working the tuning-fork vibrator in accordance with the difference between the vibration frequency of the tuning-fork vibrator and the said desired frequency so that the difference may be reduced, and terminating the third step when it is detected that the difference has become smaller than a predetermined value.

11. A method for frequency regulating a tuning-fork vibrator according to any one of claims 2, 3, 5, 6, 1, 8 or 9, characterized in that when the working in the first or second step is started, an open-close vibration between the two legs of the tuning-fork vibrator and an unbalanced vibration of the tuning-fork vibrator are respectively detected; determining whether both vibrations are of the same phase or opposite phases; and based on said determination, determining which of the legs of the tuning-fork vibrator should be worked first.

* * * * *